United States Patent [19]

Etoh et al.

[11] Patent Number: 5,383,080
[45] Date of Patent: Jan. 17, 1995

[54] SEMICONDUCTOR INTEGRATED CIRCUIT HAVING VOLTAGE LIMITER CIRCUIT

[75] Inventors: Jun Etoh, Hachioji; Masakazu Aoki, Tokorozawa; Masashi Horiguchi, Kawasaki; Shigeki Ueda, Hachioji; Hitoshi Tanaka, Tachikawa; Kazuhiko Kajigaya, Iruma; Tsugio Takahashi, Ome; Hiroshi Kawamoto, Kodaira, all of Japan

[73] Assignees: Hitachi, Ltd.; Hitachi VLSI Engineering Corporation, both of Tokyo, Japan

[21] Appl. No.: 917,995

[22] Filed: Jul. 24, 1992

[30] Foreign Application Priority Data

Jul. 25, 1991 [JP] Japan ................................ 3-186100

[51] Int. Cl.$^6$ .............................................. H02H 3/00
[52] U.S. Cl. ............................................ 361/56; 361/91
[58] Field of Search ..................... 361/56, 91, 118; 363/20, 21, 97; 365/226, 227

[56] References Cited

U.S. PATENT DOCUMENTS 4,731,719  3/1988  Nelson .................................. 363/20
4,930,112  5/1990  Tanaka et al. ........................ 365/226

Primary Examiner—Marc S. Hoff
Assistant Examiner—S. Jackson
Attorney, Agent, or Firm—Antonelli, Terry, Stout & Kraus

[57] ABSTRACT

A voltage limiter circuit is disposed in a semiconductor IC chip in order to reduce an operating voltage of an internal circuit of a scaled-down element. A small capacitance of a Vcc wiring by the disposition constitutes a resonance circuit together with an inductance of the Vcc wiring. Resonance at the resonance circuit causes large variation of a supply current and noise. An additional capacitance is connected between the Vcc wiring and a Vss wiring in order to suppress the variation and noise. The capacitance is formed by a PN junction and is connected in series to a damping resistance.

25 Claims, 7 Drawing Sheets

SEMICONDUCTOR INTEGRATED CIRCUIT HAVING VOLTAGE LIMITER CIRCUIT

BACKGROUND OF THE INVENTION

The present invention relates to a semiconductor integrated circuit having a voltage limiter circuit provided in a semiconductor chip.

The recent advances made in the area of high integration of semiconductor integrated circuits have been significant. As an example, an MOS dynamic memory (hereinafter referred to as DRAM) is now mass-produced for 4 megabits and, experimentally, has been shown to be manufacturable, for 16 megabits. Such high integration and large capacity bring about increased power consumption due to increased parasitic capacitances. Further, the high integration and the large capacity are mainly supported by scaling-down of elements but the scaling-down of the elements reduces the breakdown immunity of the elements. In recent years, accordingly, there has developed a tendency towards reducing an operating voltage of circuits within the semiconductor integrated circuit device from the standpoint of desiring both a of reduction of the power consumption and securement of the breakdown immunity of the elements.

In one method of reducing the operating voltage of the circuit, a voltage limiter circuit is provided in a semiconductor integrated circuit chip to reduce a supply voltage (internal supply voltage) within the chip. In this method, a supply voltage (external supply voltage) applied to the chip may be the same as a supply voltage generally used and, accordingly, a user can conveniently use it.

The voltage limiter circuits of this type are disclosed in JP-A-2-198096 and JP-A-1-136361 and IEEE Journal of Solid State Circuits, Vol. SC-22, No. 3, pp. 437–441, June 1987. Any one of these voltage limiter circuits can be provided within a chip to lower an external supply voltage applied to the chip to form an internal supply voltage which is supplied to a memory circuit or a logic circuit provided in the same chip.

SUMMARY OF THE INVENTION

Figure 2:
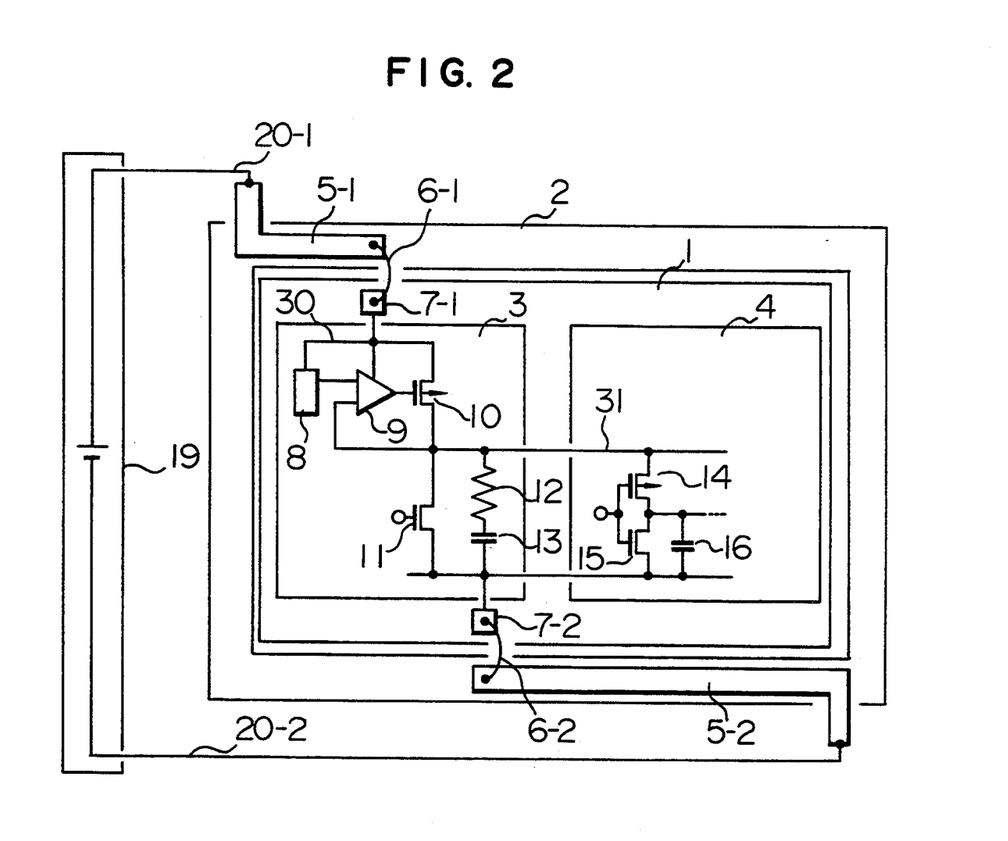
FIG. 2 schematically illustrates a DRAM using a voltage limiter circuit studied by the inventors prior to constituting the invention.

An LSI having the voltage limiter circuit within the chip has a problem that an electrostatic breakdown tends to occur at a power supply pin (Vcc pin). FIG. 2 schematically illustrates an LSI studied by the inventors prior to filing of this application and which employs the voltage limiter circuit. Transistors with an arrow represent P-channel transistors and transistors without an arrow represent N-channel transistors. In FIG. 2, numeral 1 denotes an LSI chip and 2 a package on which the LSI chip is mounted. On the chip, numeral 3 denotes a voltage limiter circuit portion and 4 an internal circuit portion of a memory or a logic circuit.

The voltage limiter circuit 3 includes a reference voltage generating circuit 8 for generating a reference voltage for producing an internal supply voltage, a differential amplifier circuit 9, an output transistor 10, a transistor 11 for supplying an idling current, a resistor 12 and a capacitance 13 for phase compensation.

A CMOS inverter composed of transistors 14 and 15 and a capacitor 16 represents the internal circuit 4 constituting the memory or the logic circuit equivalently.

Numerals 7-1 and 7-2 denote bonding pads with the pad 7-1 applied with a high potential (Vcc) and the pad 7-2 applied with a low potential (Vss).

Numerals 6-1 and 6-2 denote bonding wires and 5-1 and 5-2 inner leads in the package with the lead 5-1 for a Vcc pin and the lead 5-1 for a Vss pin.

Numeral 19 denotes an external power supply, and 20-1 and 20-2 external supply wirings for connecting the external power supply 19 with the Vcc pin and the Vss pin of the package, respectively.

Figure 5:
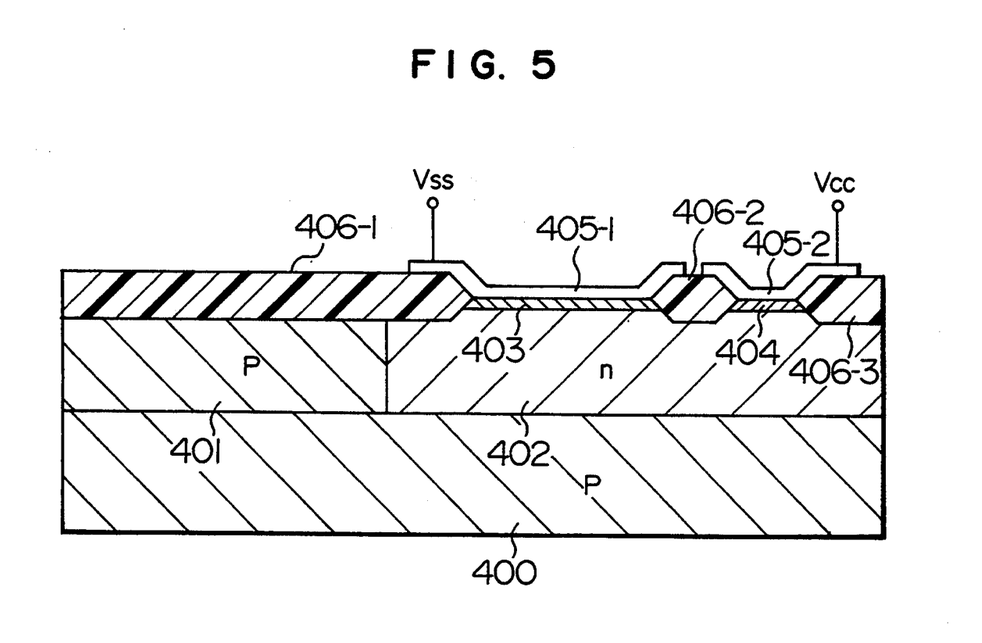
FIG. 5 is a sectional view schematically illustrating a structure of a capacitance provided between a Vcc wiring and a Vss wiring.

In the LSI having the voltage limiter circuit within the chip as described above, the supply wiring (Vcc wiring) 6-1 for supplying an external supply voltage to the voltage limiter circuit 3 from the Vcc pin 5-1 is electrically connected with an output wiring 31 of the voltage limiter circuit 3 (that is, an internal supply wiring ($V_{cl}$ wiring) 31 constituting the supply wiring of the internal circuit 4 which is the memory circuit or the logic circuit) through an impedance of the voltage limiter circuit 3. The impedance (as viewed from the side of the Vcc wiring) cannot be made small in order to maintain characteristics of the voltage limiter circuit 3 since a voltage variation at the Vcc wiring appears as an output voltage variation of the voltage limiter circuit 3 when the impedance is small. In this manner, since the impedance of the voltage limiter circuit 3 measured from the Vcc pin side is large, a capacitance of the Vcc wiring, is small. Further, an area of a PN junction connected to the Vcc wiring, to be described later with reference to FIG. 5, is also small because of the same reason. In other words, when the voltage limiter circuit 3 is omitted and the high-potential bonding pad 7-1 is directly connected to the supply wiring 31 of the internal circuit 4, the capacitance of the Vcc wiring and the area of the PN junction are increased.

In a typical LSI, the capacitance of the Vcc wiring and the PN junction acts as follows. When a surge voltage is applied to the Vcc pin, propagation of the surge voltage to the internal circuit is delayed by the capacitance and a resistance of the Vcc wiring. The PN junction is broken down during the delay time and a peak value of the surge voltage is reduced. Thus, the large surge voltage is not applied to the internal circuit.

However, when the voltage limiter circuit is used, since the capacitance of the Vcc wiring is small, as described above, and the area of the PN junction is small, the propagation delay of the surge voltage becomes small and a current flowing through the PN junction becomes also small. Accordingly, the surge voltage cannot be reduced. Thus, a large surge voltage is applied to the internal circuit and circuit elements are broken down. Further, when the area of the PN junction is small, the PN junction itself is broken down. In this manner, when the voltage limiter circuit is used, the breakdown immunity to the static electricity applied to the Vcc node is deteriorated. However, as a countermeasure thereto, when a capacitance is connected to the Vcc pin, the electrostatic breakdown immunity is improved. The static electricity occurs upon dicing of a wafer, mounting of a chip onto a package, marking of a product name onto a molded LSI or the like. Accordingly, a countermeasure to the static electricity on the LSI chip is required. In other words, when a capacitance is provided outside of the chip, there is a possibility that the electrostatic breakdown occurs during manufacturing of the chip, while previous provision of a capacitance in a chip is advantageous in that the electrostatic breakdown immunity is enhanced and yield of LSI's is improved.

Figure 3A:
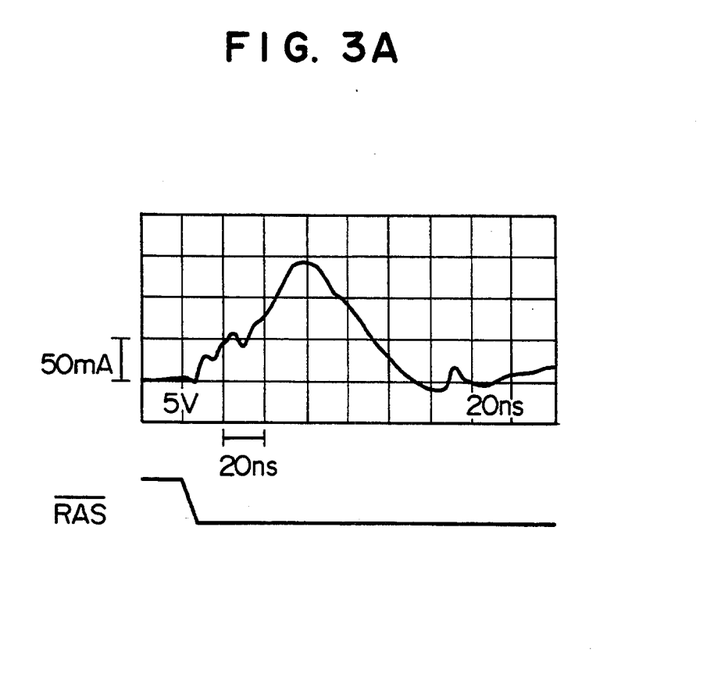
FIGS. 3A and 3B show waveforms of supply currents of an LSI not having a voltage limiter circuit and an LSI having the voltage limiter circuit, respectively.
Figure 3B:
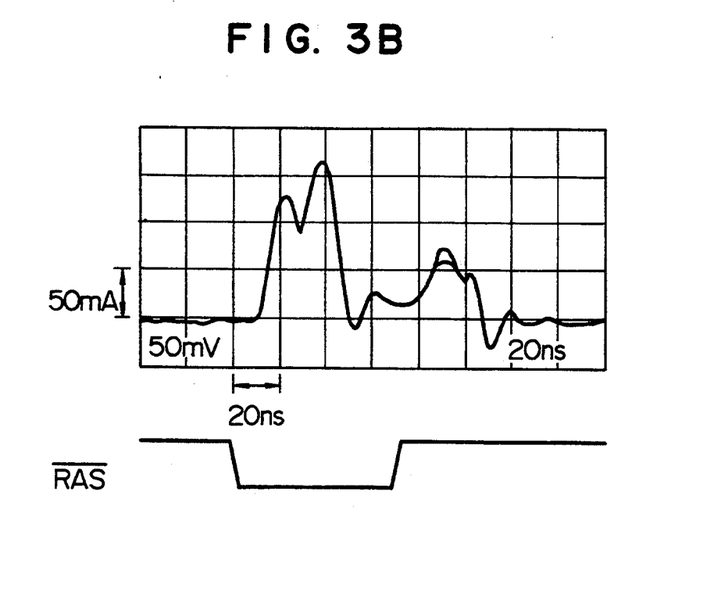

In the LSI having the voltage limiter circuit in a chip, it has been found that when the LSI is operated, a supply current varies very greatly. FIG. 3 shows waveforms of supply currents at a read cycle of a DRAM with FIG. 3A for the case where an external supply voltage is directly supplied to a memory circuit and FIG. 3B for the case where the external supply voltage is supplied to the memory circuit through the voltage limiter circuit. The large variation of the supply current is mainly caused by a resonance by an inductance of a supply wiring outside the chip and a capacitance of the Vcc wiring inside the chip.

Figure 4A:
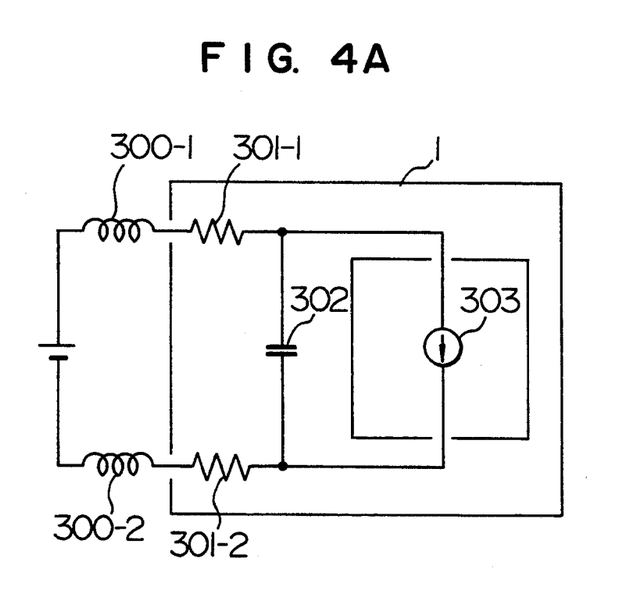
FIGS. 4A and 4B are equivalent circuit diagrams associated with a voltage limiter circuit is a DRAM chip, respectively.
Figure 4B:
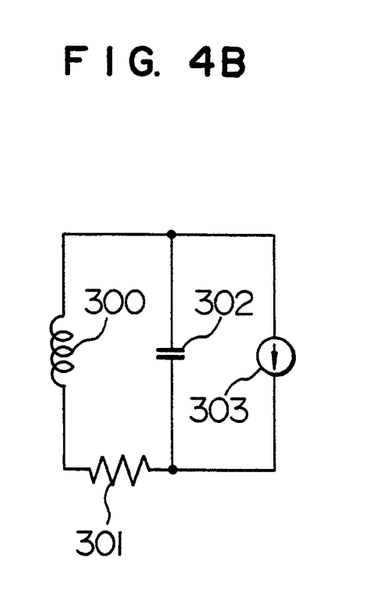

When the voltage limiter circuit 3 shown in FIG. 2 is equivalently replaced by a current source having a large impedance, the circuit of the Vcc wiring of FIG. 2 is expressed equivalently as shown in FIG. 4A. In FIG. 4A, numeral 300-1 and 300-2 denote inductances generated by the external supply wiring, an inner lead and the bonding wire, 301-1 and 301-2 resistances of the supply wiring in the chip, 302 a capacitance of the supply wiring in a chip, and 303 a current source equivalent to the voltage limiter circuit. The circuit of FIG. 4A is further simplified by replacing with an LCR resonance equivalent circuit as shown in FIG. 4B. The resonance condition of the LCR resonance circuit is given by $$4L/CR^2 > 1$$

When R is small, a resonance frequency is $\omega 2 = 1/LC$.

Accordingly, it can be understood that when the capacitance C is small, the resonance condition is satisfied, so that the resonance frequency is increased. As described above, in the LSI having the voltage limiter circuit in the chip, since the capacitance of the Vcc wiring is small, the resonance condition is satisfied. Further, since a period of the resonance is coincident with an operating timing of the circuit block of the LSI, variation of the supply current is increased. The increased variation of the supply current increases a voltage variation of the supply wiring on a board on which the LSI is mounted. The voltage variation causes malfunction of another LSI on the same board. Further, the variation of the supply current produces noise in an apparatus using the LSI or an equipment disposed near the apparatus due to an electromagnetic induction. The noise causes malfunction of the apparatus or equipment. Accordingly, it is necessary to suppress the large variation of the supply current and the noise and prevent malfunction of the apparatus or equipment.

The present invention has been made on the basis of the results studied by the inventors as described above, and an object of the present invention is to suppress large variation of a supply current and noise in a semiconductor integrated circuit having a voltage limiter circuit in a chip.

Another object of the present invention is to provide a semiconductor integrated circuit (IC) having a voltage limiter circuit in a chip in which breakdown immunity capability for static electricity from a Vcc pin of the IC is improved.

In order to achieve the first object mentioned, in a representative aspect of the present invention, an additional capacitance element is provided for connection between a high-potential supply wiring (Vcc wiring) and a low-potential supply wiring (Vss wiring) in addition to a small capacitance inherently built-in to the voltage limiter circuit with respect to the high-potential supply wiring (Vcc wiring) in the chip.

Since the additional capacitance reduces the resonance frequency, the operating timing of the circuit block of the LSI is not coincident with the resonance frequency. Consequently, the large variation in the supply current of the LSI can be suppressed, the variation in the supply voltage can be made small, and occurrence of noise due to electromagnetic induction can be prevented.

In a more preferred aspect, a resistor element is connected in series to the capacitance. The resistor element can be operated as a damping resistor and reduce the resonance frequency more effectively.

In order to achieve the second object mentioned, in another representative aspect of the present invention, a capacitance constituted by a PN junction is provided between the high-potential supply wiring (Vcc wiring) and the low-potential supply wiring (Vss wiring) in the chip. The provision of the capacitance between the Vcc wiring and the Vss wiring can increase the capacitance of the Vcc wiring and propagation delay of a surge voltage and reduce the surge voltage applied to circuit elements. Further, since the capacitance is formed by the PN junction, an area of the PN junction of the Vcc wiring is increased, so that a current value flowing through the PN junction can be increased. Thus, the surge voltage can be made small, breakdown of the element and the PN junction itself can be prevented.

Other objects and features of the present invention will be apparent from an embodiment to be described later.

The embodiment of the present invention is now described in detail in conjunction with the accompanying drawings.

DESCRIPTION OF THE PREFERRED EMBODIMENTS

An embodiment of the present invention is now described with reference to FIG. 1.

Figure 1:
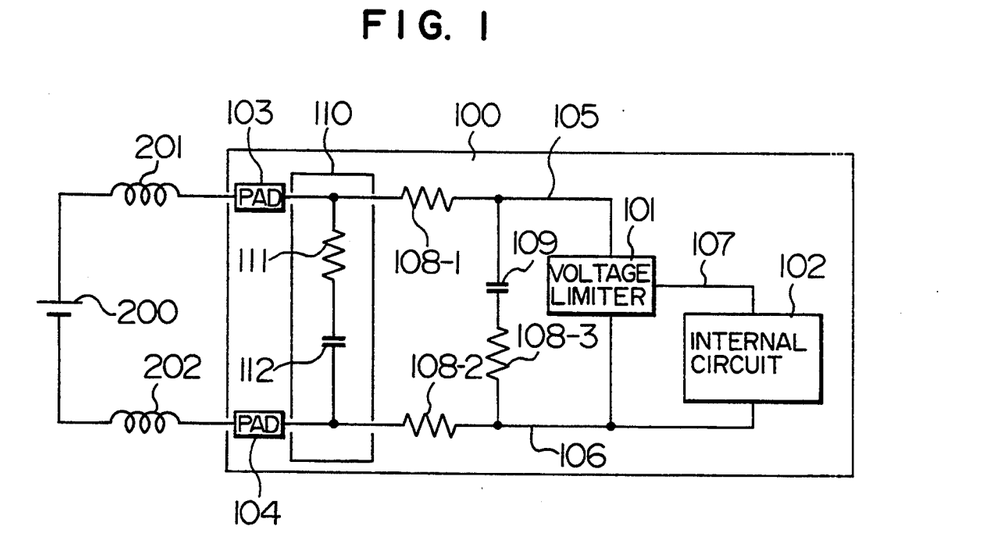
FIG. 1 is a circuit diagram showing an embodiment of the present invention.

In FIG. 1, numeral 100 denotes a semiconductor chip, 101 a voltage limiter circuit, 102 an internal circuit of a memory circuit or a logic circuit, and 103 and 104 input terminals from an external power supply. The input terminal 103 is used for a high potential Vcc and the input terminal 104 is used for a low potential Vss. Numerals 105 and 106 supply wirings for a high potential (hereinafter referred to as a Vcc wiring) and a low potential (hereinafter referred to as a Vss wiring) in a chip, respectively. Numeral 107 denotes an internal supply wiring (hereinafter referred to as a $V_{cl}$ wiring) connected to an output of the voltage limiter circuit 101. Numeral 109 denotes a capacitance of the supply wirings 105 and 106, and 108-1 and 108-2 resistances of the supply wirings. In addition, most of the capacitances are formed between a wiring layer and a substrate and accordingly a resistance 108-3 of the substrate is connected to the capacitance 109. Numeral 200 denotes the external power supply and 201 and 202 inductances of wirings of the external power supply.

In the embodiment of FIG. 1, a series circuit 110 of a capacitance 112 and a resistance 111 is connected between the Vcc wiring and the Vss wiring in the chip. The capacitance 112 is formed by a PN junction. Thus, since the capacitance of the Vcc wiring is increased, the propagation delay of a surge voltage is increased. The PN junction of the capacitance is broken down during the propagation of the surge voltage and, therefore the large surge voltage is not applied to the voltage limiter circuit in the chip. Accordingly, the electrostatic breakdown immunity can be improved.

FIG. 5 schematically illustrates an example of the capacitance 112 connected to the Vcc wiring and the Vss wiring and formed by the PN junction. More particularly, FIG. 5 is a sectional view of the capacitance connected between the Vcc wiring and the Vss wiring, in which numeral 400 denotes a P-type semiconductor substrate, 401 a P-well, 402 an N-well, 403 a P-type diffusion layer having a high impurity concentration, and 404 an N-type diffusion layer having a high impurity concentration. Thus, the PN junction constituting the capacitance is formed by the N-well 402 and the P-type diffusion layer 403 and an ohmic contact is formed between the N-well 402 and the N-type diffusion 404. Numerals 405-1 and 405-2 denote electrode layers connected to the P-type diffusion layer 403 and the N-type diffusion layer 404, respectively, and which are connected to the Vss wiring and the Vcc wiring, respectively. Numerals 406-1 and 406-2 denote field oxides.

When a high potential is applied to the Vcc wiring and a low potential is applied to the Vss wiring, the PN junction formed of the N-well 402 and the P-type diffusion layer 403 is reversely biased to form a capacitance. Accordingly, a high surge voltage applied to the Vcc pin is limited to the breakdown voltage of the PN junction. Thus, since the surge voltage applied to the voltage limiter circuit 101 within the LSI is reduced, the electrostatic breakdown immunity capability of the LSI can be increased.

In the embodiment of FIG. 5, since an area of the PN junction is large, a current value flowing through the PN junction can be increased. The PN junction itself is not broken down. The N-well 402 is used as one electrode of the capacitance. Generally, since a resistivity of the N-well 402 is larger than that of the P-type or N-type diffusion layer 403 or 404, a parasitic resistance is produced between the P-type diffusion layer 403 and the N-type diffusion layer 404. Accordingly, a resistance as the series resistance 111 is connected in series to the capacitance of the PN junction between the Vcc wiring and the Vss wiring automatically. Thus, it is not necessary to provide a resistance separately and increase of a chip size can be suppressed.

In the series connection of the resistance and the capacitance, when a value of the resistance or the capacitance is increased, it acts to reduce a resonance frequency, and when the value of the capacitance exceeds a certain value, the resonance does not occur. When the resonance frequency is reduced and the resonance period is increased, the resonance frequency is not matched to the operating timing of the circuit block of the LSI, so that large variation of a supply current can be suppressed. Accordingly, a voltage drop in the supply wiring of the board on which the LSI is mounted can be made small and occurrence of noise due to the electromagnetic induction can be suppressed. Thus, malfunction of an apparatus due to noise can be prevented.

As described above, the resistance connected in series to the capacitance constitutes a damping resistance, so that resonance by the inductance of the external supply wiring and the capacitance 112 can be suppressed. Even if the resistance is provided on the Vcc wiring or the Vss wiring, the same effects can be attained. However, a voltage drop is produced across the resistance and, accordingly, the resistance may be connected in parallel with the main current path as shown in the embodiment of FIG. 1.

Figure 6:
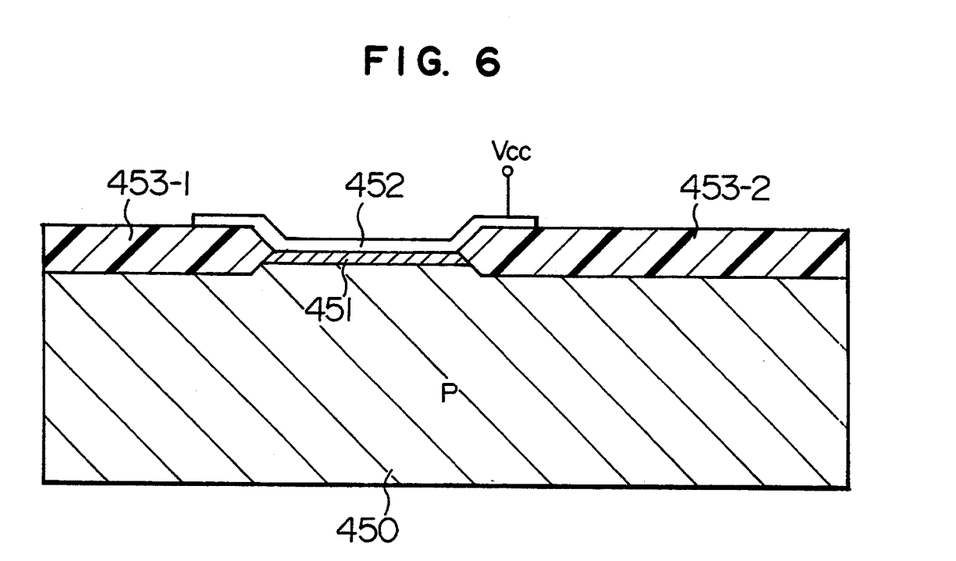
FIGS. 6 and 7 are sectional views schematically illustrating other structures of capacitances between the Vcc wiring and the Vss wiring.

FIG. 6 schematically illustrates another structure of the capacitance provided between the Vcc wiring and the Vss wiring. In FIG. 6, numeral 450 denotes a P-type semiconductor substrate having a low impurity concentration, and 451 an N-type diffusion layer having a high impurity concentration. Accordingly, the P-type semiconductor substrate 450 and the N-type diffusion layer 451 constitute a PN junction. Numeral 452 denotes an electrode layer connected to the N-type diffusion layer and which is connected to the Vcc wiring. Numerals 453-1 and 453-2 denote field oxides. The P-type semiconductor substrate 450 is connected to the Vss wiring. When a high potential is applied to the Vcc wiring and a low potential is applied to the Vss wiring, the PN junction is reversely biased to form the capacitance. In this manner, the capacitance can be formed by the PN junction even if any well layer is not provided. In this example, the semiconductor substrate is connected to the Vss wiring, while the semiconductor substrate may be connected to a power supply for generating a substrate bias voltage $V_{BB}$. In any case, the resistance of the P-type semiconductor substrate 450 can be utilized as a series resistance connected to the capacitance and a layout area required for the resistance can be reduced.

Figure 7:
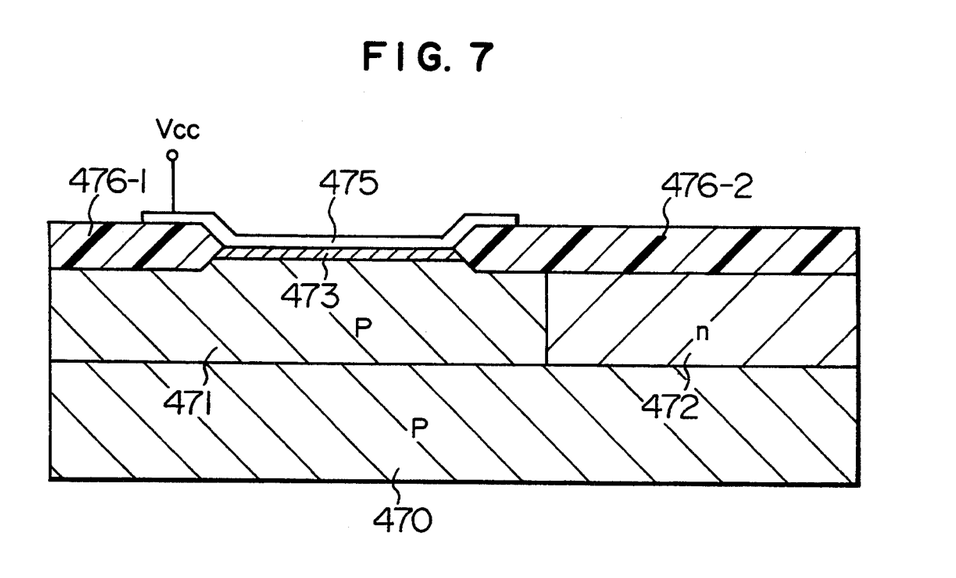

FIG. 7 schematically illustrates a further structure of the capacitance provided between the Vcc wiring and the Vss wiring. In FIG. 7, numeral 470 denotes a P-type semiconductor substrate having lightly-doped impurity, 471 a P-well having a low impurity, concentration, 472 an N-well having a low impurity concentration, and 473 an N-type diffusion layer having highly-doped impurity. Thus, a PN junction is formed by the P-well 471 and the N-type diffusion layer 473. Numeral 475 denotes an electrode layer connected to the N-type diffusion layer and which is connected to the Vcc wiring. Numerals 476-1 and 476-2 denote field oxides. The P-type semiconductor substrate 470 is connected to a power supply for a substrate bias voltage $V_{BB}$ and similarly the capacitance is formed by the PN junction.

Figure 8:
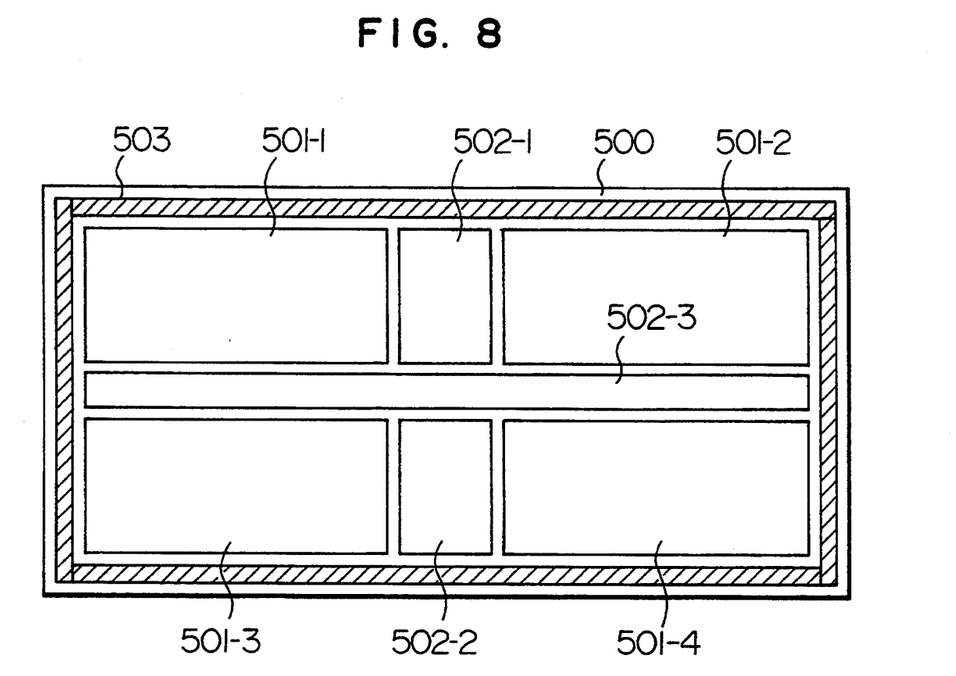
FIG. 8 schematically illustrates a chip layout of a capacitance disposed between the Vcc wiring and the Vss wiring.

FIG. 8 schematically illustrates a layout on a semiconductor chip constituting the capacitance provided between the Vcc wiring and the Vss wiring and the semiconductor chip constitutes a DRAM as an example. In FIG. 8, numeral 500 denotes a semiconductor chip, 501-1, 501-2, 501-3 and 501-4 memory array areas, 502-1, 502-2 and 502-3 peripheral circuit areas for driving the memory arrays, and 503 a capacitance area disposed between the Vcc wiring and the Vss wiring. In this manner, since the capacitance is disposed on the outer edge of the semiconductor chip, the size of the capacitance can be adjusted freely. As shown in FIG. 8, since a distance between the memory arrays and the outer edge of the semiconductor chip is ensured by the capacitance area, it can be prevented that a data retention time of the memory is reduced by a mechanical stress occurring at the outer edge of the semiconductor chip.

Figure 9:
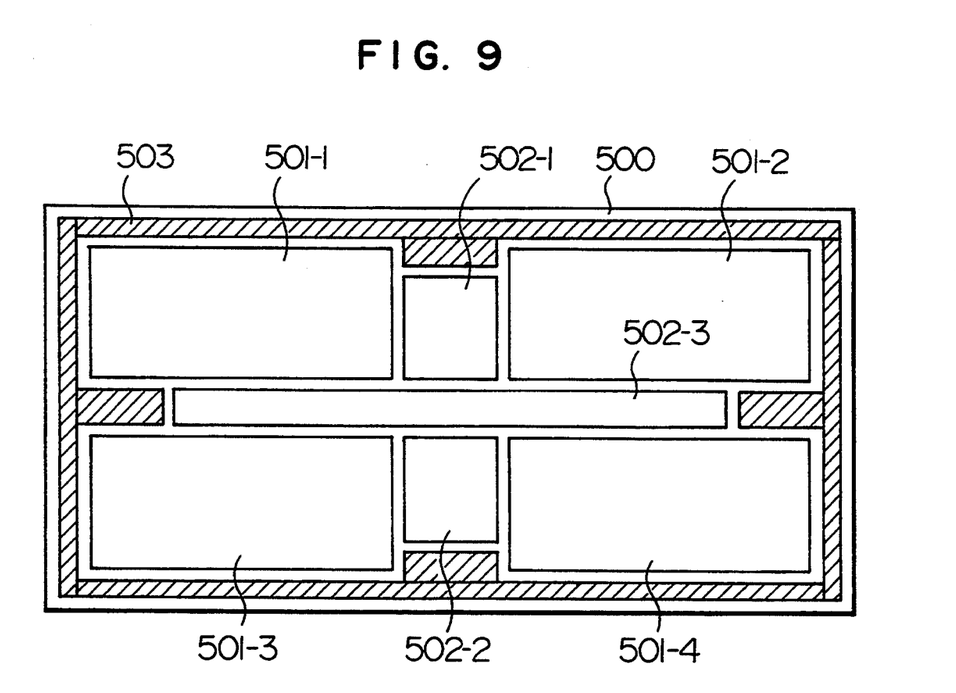
FIGS. 9 and 10 schematically illustrate other chip layouts of capacitances disposed between the Vcc wiring and the Vss wiring.

FIG. 9 schematically illustrates another structure of the capacitance and is different from FIG. 8 in that capacitances are provided even for the peripheral circuit areas 502-1, 502-2 and 502-3. Normally, the peripheral circuit area includes areas in which any circuit portion is not provided at a peripheral portion of the chip. Provision of the capacitance in such an area can reduce the chip size.

Figure 10:
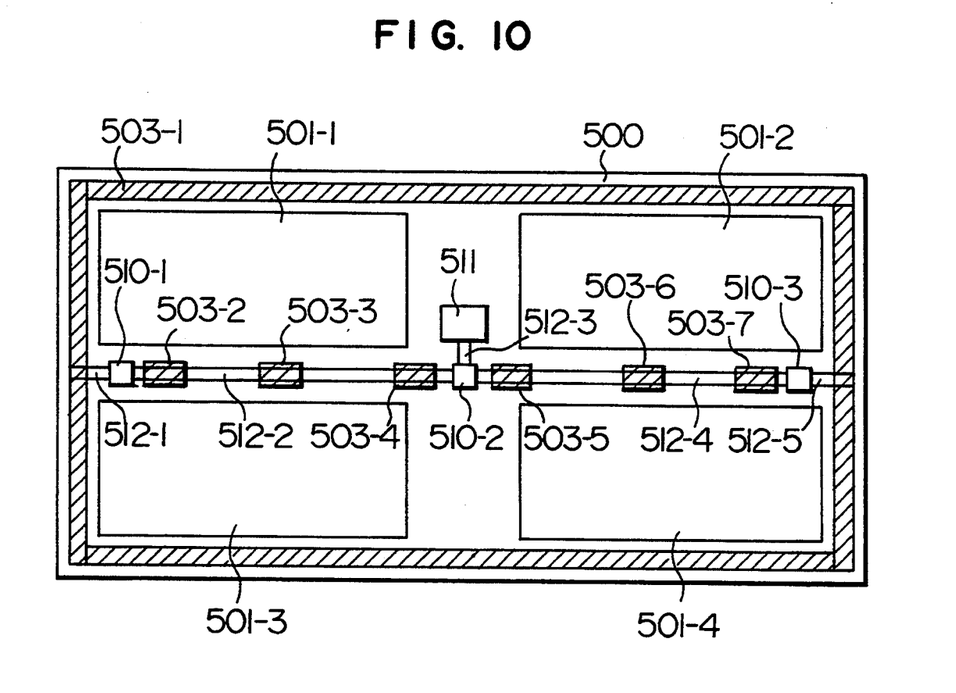

FIG. 10 schematically illustrates another structure of the capacitance. In FIG. 10, numeral 500 denotes a semiconductor chip, 501-1, 501-2, 501-3 and 501-4 memory array areas, 511 a voltage limiter circuit, 510-1, 510-2 and 510-3 bonding pads for connecting a power supply for Vcc, 512-1, 512-2, 512-3, 512-4 and 512-5 supply wirings, and 503-1, 503-2, 503-3, 503-4, 503-5, 503-6 and 503-7 capacitance areas, which are disposed in areas for peripheral circuits to reduce a size of a chip.

Figure 11A:
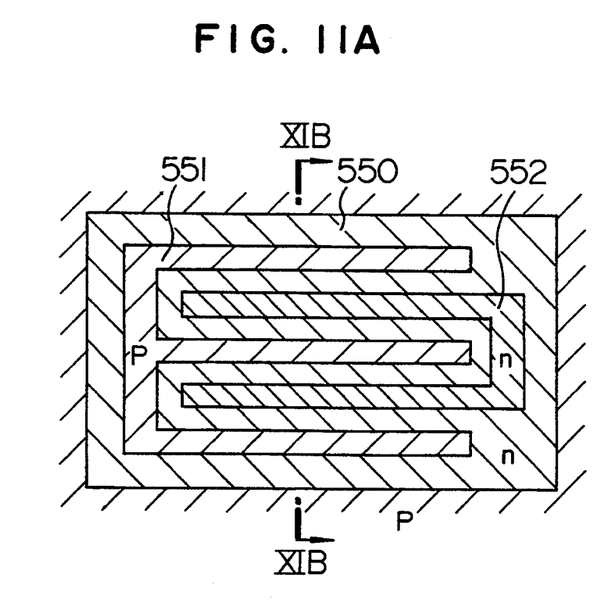
FIGS. 11A and 11B schematically illustrate other structures of a capacitance disposed between the Vcc wiring and the Vss wiring.
Figure 11B:
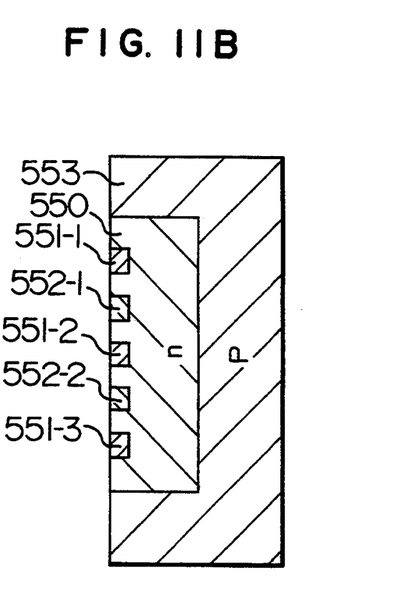

FIG. 11 schematically illustrates another structure of the capacitance. FIG. 11A is a plan view and FIG. 11B is a sectional view taken along line XIB—XIB. In FIG. 11B, numeral 553 denotes a P-type semiconductor substrate, 550 an N-well having a low impurity concentration, 551, 551-1, 551-2 and 551-3 P-type diffusion layers each having a high impurity concentration, and 552, 552-1 and 552-2 an N-type diffusion layer having a high impurity concentration. By forming the P-type diffusion layers 551 with a high impurity and the N-type diffusion layers with a high impurity concentration into a comb, a resistance connected to the capacitance parasitically can be reduced. Specially, a parasitic resistance formed in the N-well can be reduced. Further, since the Vcc wiring is disposed to be opposite to the Vss wiring, any inductance does not occur newly. In addition, a side wall portion of the P-type diffusion layer 551 can be utilized as the capacitance.

Figure 12:
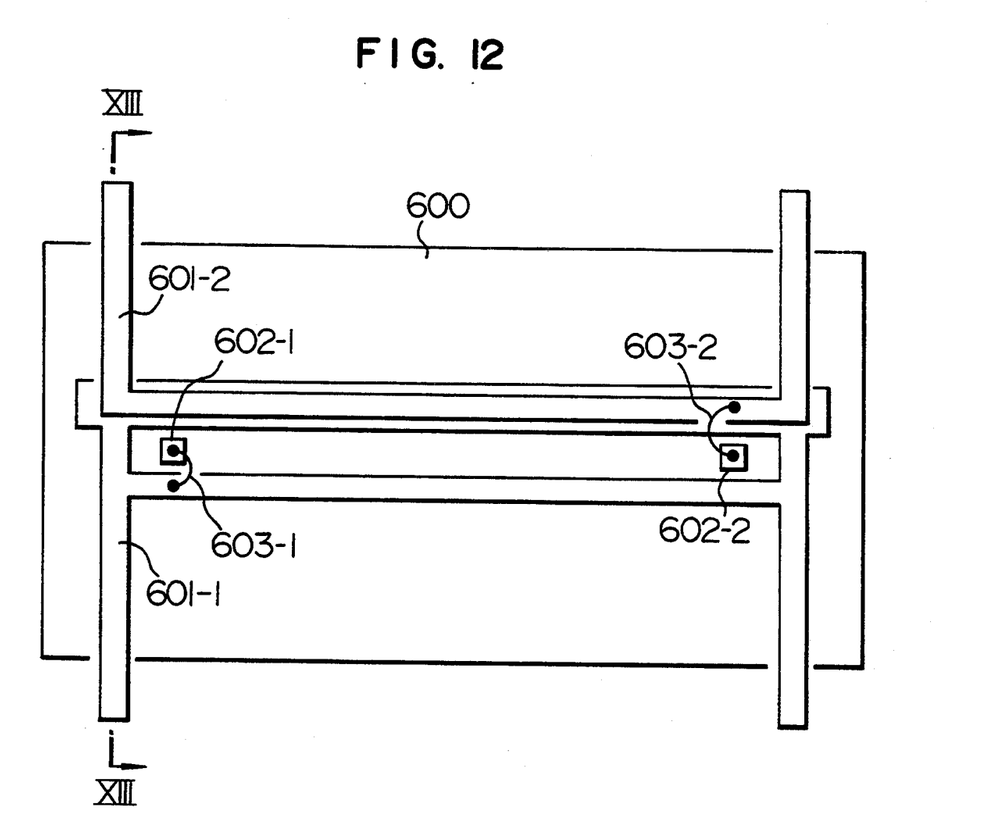
FIGS. 12 and 13 schematically illustrate structure of a capacitance using inner leads.
Figure 13:
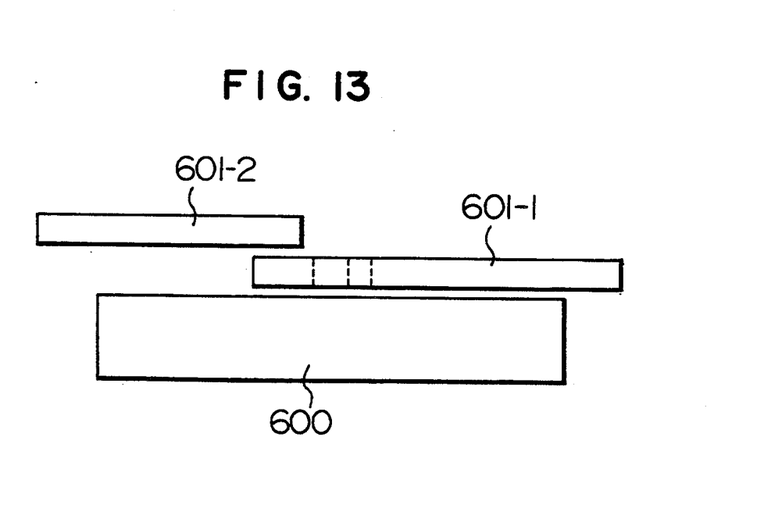

FIGS. 12 and 13 schematically illustrate another structure of the capacitance, in which inner lead is utilized in a package of a lead-on-chip (LOC) structure to form the capacitance.

In FIG. 12, numeral 600 denotes a semiconductor chip, and 601-1 and 601-2 inner leads. Only two inner leads are shown in FIG. 12, while actually a number of inner leads are disposed on the semiconductor substrate. Numeral 602-1 and 602-2 denotes bonding pads, and 603-1 and 603-2 bonding wires.

FIG. 13 is a sectional view taken along line XIII—XIII of FIG. 12. When it is assumed that the inner lead 601-1 is the Vcc wiring and the inner lead 601-2 is the Vss wiring, the capacitance can be formed by inserting dielectric material into an overlapped portion between the inner lead 601-1 and 601-2. In this manner, utilization of the inner leads to form the capacitance can reduce a chip area of the integrated circuit. Further, since the overlapped area of the inner leads can be increased freely as far as the overlapped area is within a size of the integrated circuit chip, the degree of freedom for a design of the capacitance is increased. The package having the lead-on-chip (LOC) structure has been described, while a package having the chip-on-lead (COL) structure can be also used in the same manner.

The embodiments of the present invention have been described, while it is needless to say that the present invention is not limited to the embodiments and various modifications can be made within the scope of the technical idea of the present invention.

For example, in FIG. 1, a peripheral circuit which operates by the high external power supply 200 can be connected between the Vcc wiring 105 and the Vss wiring 106.

As described above, according to the present invention, in the semiconductor integrated circuit having the voltage limiter circuit within the chip, variation of the supply current can be reduced.

Further, according to the present invention, in the semiconductor integrated circuit having the voltage limiter circuit within the chip, the breakdown immunity capability for static electricity from the Vcc pin can be improved.

What is claimed is:

1. A semiconductor integrated circuit comprising:
    a high-potential input terminal and a low-potential input terminal;
    a voltage limiter circuit adapted to be supplied with a supply voltage between said high-potential input terminal and said low-potential input terminal to generate a limited operating voltage smaller than the supply voltage;
    an inner circuit adapted to be supplied with said limited operating voltage;
    a capacitance connected between said high-potential input terminal and said low-potential input terminal so as to suppress a large variation of a supply current; and
    a resistance connected in series to said capacitance, wherein said capacitance is formed by a PN junction in a semiconductor chip.

2. A semiconductor integrated circuit according to claim 1, wherein said PN junction is formed of a P-type semiconductor substrate and an N-type diffusion layer.

3. A semiconductor integrated circuit according to claim 1, wherein said PN junction is formed of a P-type well layer and an N-type diffusion layer.

4. A semiconductor integrated circuit according to claim 1, wherein said PN junction is formed along an external edge of a semiconductor chip.

5. A semiconductor integrated circuit according to claim 1, wherein said PN junction is formed of an N-type well layer and a P-type diffusion layer.

6. A semiconductor integrated circuit according to claim 5, wherein said PN junction is formed along an external edge of a semiconductor chip.

7. A semiconductor integrated circuit comprising:
a high-potential input terminal and a low-potential input terminal;
a voltage limiter circuit adapted to be supplied with a supply voltage between said high-potential input terminal and said low-potential input terminal to generate a limited operating voltage smaller than the supply voltage;
an inner circuit adapted to be supplied with said limited operating voltage; and
a capacitance connected between said high-potential input terminal and said low-potential input terminal so as to suppress a large variation of a supply current,
wherein said capacitance is formed by an overlapping arrangement of a first lead connected to said high-potential input terminal and a second lead connected to said low-potential input terminal, said first and second leads corresponding to inner leads overlying a main surface of a semiconductor chip.

8. A semiconductor integrated circuit comprising:
a high-potential input terminal and a low-potential input terminal;
a voltage limiter circuit applied with a supply voltage between said high-potential input terminal and said low-potential input terminal to generate a limited operating voltage smaller than the supply voltage;
an inner circuit supplied with said limited operating voltage; and
a capacitance connected between said high-potential input terminal and said low-potential input terminal to suppress large variation of a supply current,
said capacitance being formed by a PN junction in a semiconductor chip.

9. A semiconductor integrated circuit according to claim 8, wherein said PN junction is formed of an N-type well layer and a P-type diffusion layer.

10. A semiconductor integrated circuit according to claim 8, wherein said PN junction is formed of a P-type semiconductor substrate and an N-type diffusion layer.

11. A semiconductor integrated circuit according to claim 8, wherein said PN junction is formed of a P-type well layer and an N-type diffusion layer.

12. A semiconductor integrated circuit according to claim 8, wherein said PN junction is formed along an external edge of a semiconductor chip.

13. A semiconductor integrated circuit according to claim 5, wherein said N-type well layer is lightly doped with an impurity, said P-type diffusion layer is heavily doped with an impurity, and said resistor is formed by said lightly doped well layer.

14. A semiconductor integrated circuit according to claim 2, wherein said N-type diffusion layer is heavily doped with an impurity, said P-type semiconductor substrate is lightly doped with an impurity, and said resistor is formed by said lightly doped semiconductor substrate.

15. A semiconductor integrated circuit according to claim 13, wherein said P-type well layer is lightly doped with an impurity, said N-type diffusion layer is heavily doped with an impurity, and said resistor is formed by said lightly doped well layer.

16. A semiconductor integrated circuit according to claim 3, wherein the main surface of said semiconductor chip is the front face of the chip.

17. A semiconductor integrated circuit according to claim 7, wherein the main surface of said semiconductor chip is the rear face of the chip.

18. A semiconductor integrated circuit according to claim 9, wherein said N-type well layer is lightly doped with an impurity and said P-type diffusion layer is heavily doped with an impurity.

19. A semiconductor integrated circuit according to claim 10, wherein said N-type diffusion layer is heavily doped with an impurity and said P-type semiconductor substrate is lightly doped with an impurity.

20. A semiconductor integrated circuit according to claim 11, wherein said P-type well layer is lightly doped with an impurity and said N-type diffusion layer is heavily doped with an impurity.

21. A semiconductor integrated circuit formed on a semiconductor chip comprising:
a high-potential input terminal and a low-potential input terminal;
a voltage limiter circuit adapted to be supplied with a supply voltage between said high-potential input terminal and said low-potential input terminal to generate a limited operating voltage smaller than the supply voltage, said voltage limiter circuit having a capacitance inherently built-in via supply wirings coupled thereto on the chip;
an inner circuit adapted to be supplied with said limited operating voltage;
an additional capacitance connected between said high-potential input terminal and said low-potential input terminal so as to suppress a large variation of a supply current; and
a resistance connected in series to said capacitance,
wherein said additional capacitance is formed by a PN junction in said semiconductor chip.

22. A semiconductor integrated circuit according to claim 21, wherein said PN junction is formed of a lightly doped N-type well layer and a heavily doped P-type diffusion layer, said resistance being formed by said N-type well layer.

23. A semiconductor integrated circuit according to claim 21, wherein said PN junction is formed of a lightly doped P-type semiconductor substrate and a heavily doped N-type diffusion layer, said resistance being formed by said semiconductor substrate.

24. A semiconductor integrated circuit according to claim 21, wherein said PN junction is formed of a lightly doped P-type well layer and a heavily doped N-type diffusion layer, said resistance being formed by said P-type well layer.

25. A semiconductor integrated circuit according to claim 21, wherein said PN junction is formed along an external edge of a semiconductor chip.

* * * * *